United States Patent
Srinivasan et al.

(10) Patent No.: US 10,769,340 B2
(45) Date of Patent: Sep. 8, 2020

(54) AUTOMATIC MOVING OF PROBE LOCATIONS FOR PARASITIC EXTRACTION

(71) Applicant: Mentor Graphics Corporation, Wilsonville, OR (US)

(72) Inventors: Sridhar Srinivasan, Tualatin, OR (US); Yi-Ting Lee, Zhubei (TW); Patrick D. Gibson, Tualatin, OR (US); Padmaja Susarla, McLean, VA (US); Alex Thompson, Tigard, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/411,209

(22) Filed: May 14, 2019

(65) Prior Publication Data

US 2019/0354654 A1 Nov. 21, 2019

Related U.S. Application Data

(60) Provisional application No. 62/672,186, filed on May 16, 2018, provisional application No. 62/777,310, filed on Dec. 10, 2018.

(51) Int. Cl.
*G06F 30/39* (2020.01)
(52) U.S. Cl.
CPC .................. *G06F 30/39* (2020.01)
(58) Field of Classification Search
CPC ....................................... G06F 30/39
USPC ........................................ 716/112
See application file for complete search history.

(56) References Cited

U.S. PATENT DOCUMENTS

| | | | | |
|---|---|---|---|---|
| 5,530,372 | A * | 6/1996 | Lee | G01R 31/2886 324/754.03 |
| 8,166,446 | B2 * | 4/2012 | Dickson | G01R 1/07371 361/719 |
| 2004/0044973 | A1 * | 3/2004 | Parker | G01R 31/2834 716/112 |
| 2006/0129955 | A1 * | 6/2006 | Jacobsen | H05K 3/0005 324/750.16 |
| 2006/0192579 | A1 * | 8/2006 | Jacobsen | G01R 31/2801 716/137 |
| 2008/0134119 | A1 * | 6/2008 | Chen | G06F 30/392 716/120 |
| 2010/0241373 | A1 * | 9/2010 | Watanabe | G06F 30/398 702/58 |

(Continued)

*Primary Examiner* — Suresh Memula

(57) ABSTRACT

Probe location candidates for parasitic extraction are identified from geometric elements on a probe layer. The probe layer is a physical layer of a layout design for a circuit design predetermined for placing one or more new probes. The probe location candidates are geometric elements on the probe layer within a boundary of an area having a predetermined size and covering an original probe location or having a distance from the original probe location less than a predetermined value. Moreover, the probe location candidates are conductively connected to the original probe location. One or more new probe locations on the probe location candidates are selected based on predetermined criteria. From the layout design, a parasitic resistance value for parasitic resistance between a geometric element representing a circuit pad or another device pin and the new one or more probe locations is extracted.

16 Claims, 13 Drawing Sheets

Flow chart 400

(56) References Cited

U.S. PATENT DOCUMENTS

| | | | |
|---|---|---|---|
| 2011/0156031 A1* | 6/2011 | Kim | H01L 22/32 |
| | | | 257/48 |
| 2011/0191742 A1* | 8/2011 | Oberai | G06F 30/00 |
| | | | 716/136 |
| 2011/0241713 A1* | 10/2011 | Duarte De Martin | |
| | | | G01R 31/2884 |
| | | | 324/755.01 |
| 2012/0043983 A1* | 2/2012 | Sawa | G01R 31/2891 |
| | | | 324/750.19 |
| 2014/0208279 A1* | 7/2014 | Bhawmik | G06F 30/30 |
| | | | 716/106 |
| 2014/0333339 A1* | 11/2014 | Orr | H05K 1/11 |
| | | | 324/756.02 |
| 2015/0213187 A1* | 7/2015 | Goyal | G06F 30/398 |
| | | | 716/136 |
| 2018/0239857 A1* | 8/2018 | Qin | G06F 30/20 |

* cited by examiner

AUTOMATIC MOVING OF PROBE LOCATIONS FOR PARASITIC EXTRACTION

RELATED APPLICATIONS

This application claims the benefit of both U.S. Provisional Patent Application No. 62/672,186, filed on May 16, 2018, titled "Automatic Moving Of Probe Locations For Parasitic Extraction," and naming Sridhar Srinivasan et al. as inventors and U.S. Provisional Patent Application No. 62/777,310, filed on Dec. 10, 2018, titled "Connectivity-Aware Probe Modeling For Layout Design Resistance and Current Measurement," and naming Sridhar Srinivasan et al. as inventors, which applications are incorporated entirely herein by reference.

BACKGROUND OF THE DISCLOSED TECHNOLOGY

Electrostatic charge is defined as "electric charge at rest". Static electricity is an imbalance of electrical charges within or on the surface of a material. This imbalance of electrons produces an electric field that can be measured and that can influence other objects. Electrostatic discharge (ESD) is defined as the rapid, spontaneous transfer of electrostatic charge induced by a high electrostatic field. Electrostatic discharge can change the electrical characteristics of a semiconductor device, degrading or destroying it. With both the need for increased performance (devices that operate at 1 GHz and higher and high speed serial link input/outputs that operate at 20-30 gigabit per second) and the increase in the density of circuits (Moore's Law) on a device, integrated circuits are expected to become more sensitive to ESD events. This trend may be accelerating.

An ESD event will force a current pulse from few hundred milliamps to several tens of amps into the integrated circuit for a time period ranging from few nanoseconds to several microseconds. Typical power levels that need to be dissipated during an ESD event are on the order of several tens of watts. An ESD protection circuit can be used to shunt the ESD current through the unpowered IC along the intended ESD protection path, while clamping the voltage at a safe level, without causing any IC functional performance degradation. An ESD protection mechanism should therefore have the ability to protect the circuit and the components to which it is connected. This may include a fast turn-on of ESD protection device, which minimizes the voltage clamping level, and shunts ESD energy away from the protected circuit area.

To ensure a robust ESD protection design, ESD protection evaluation and verification needs to be done at every stage of an overall integrated circuit design flow. As technology scaling continues, meeting product ESD targets becomes more challenging. At 14 nm and below, for example, the physical area taken by ESD protection devices often appear to be getting bigger compared to the rapidly shrinking logic devices. This puts pressure on making sure the protection devices are sized just right to meet ESD performance without excessive margin. Another example is that the interconnect stack tends to favor more thin metal layers, which can increase the interconnect resistance to a level unseen in earlier technology nodes. Under such conditions, ESD verification faces various challenges. Fast parasitic resistance extraction without severely affecting accuracy is highly desirable.

BRIEF SUMMARY OF THE DISCLOSED TECHNOLOGY

Aspects of the disclosed technology relate to techniques of parasitic extraction based on automatic moving of probe locations. In one aspect, there is a method comprising: identifying probe location candidates for parasitic extraction from geometric elements on a probe layer, the probe layer being a physical layer of a layout design for a circuit design predetermined for placing one or more new probes, the probe location candidates being geometric elements on the probe layer within a boundary of an area having a predetermined size and covering an original probe location or having a distance from the original probe location less than a predetermined value, the probe location candidates being conductively connected to the original probe location, and the original probe location being on a geometric element representing a device pin of the circuit design on another physical layer; selecting one or more new probe locations on the probe location candidates based on predetermined criteria; and extracting, from the layout design, a parasitic resistance value for parasitic resistance between a geometric element representing a circuit pad or another device pin and the new one or more probe locations.

The method may further comprise: conducting an ESD analysis based on the parasitic resistance value; and reporting the parasitic resistance value, the result of the ESD analysis, or both.

The original probe location may be an electrode of a diode, the probe layer may be a diffusion layer, and the probe location candidates may comprise a guard ring for the diode.

The original probe location may be a gate electrode of a transistor and the probe layer may be a metal layer.

The area may form a halo surrounding a location on the probe layer corresponding to the original probe location.

The predetermined criteria may comprise distance from the original probe location, distance between the one or more new probe locations, configuration of the one or more new probe locations, or any combination thereof.

In another aspect, there is one or more computer-readable media storing computer-executable instructions for causing one or more processors to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1:
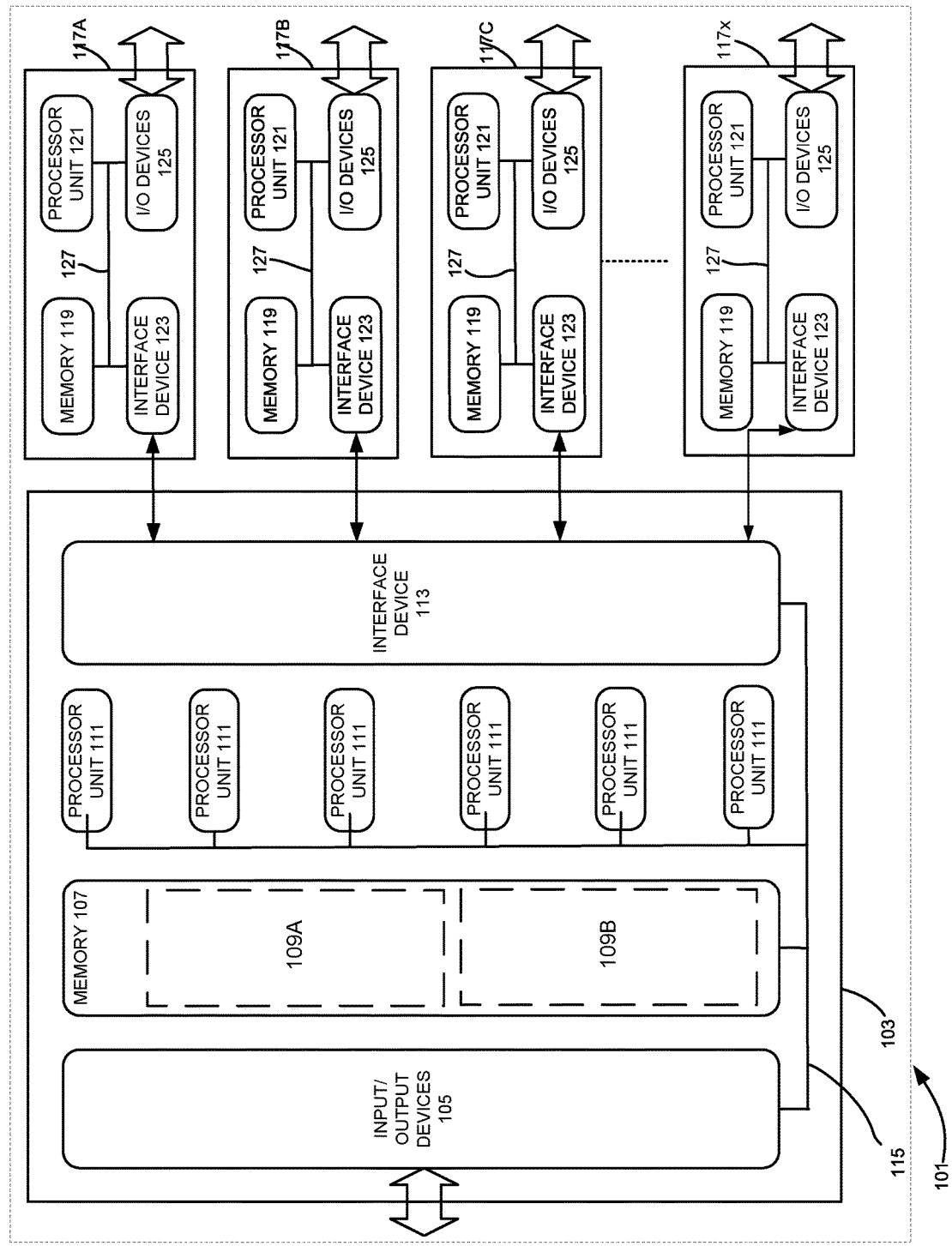
FIG. 1 illustrates an example of a computing system that may be used to implement various embodiments of the disclosed technology.

Various aspects of the present disclosed technology relate to techniques of parasitic extraction based on automatic moving of probe locations. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "identify", "select" and "extract" to describe the disclosed methods. Such terms are high-level descriptions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
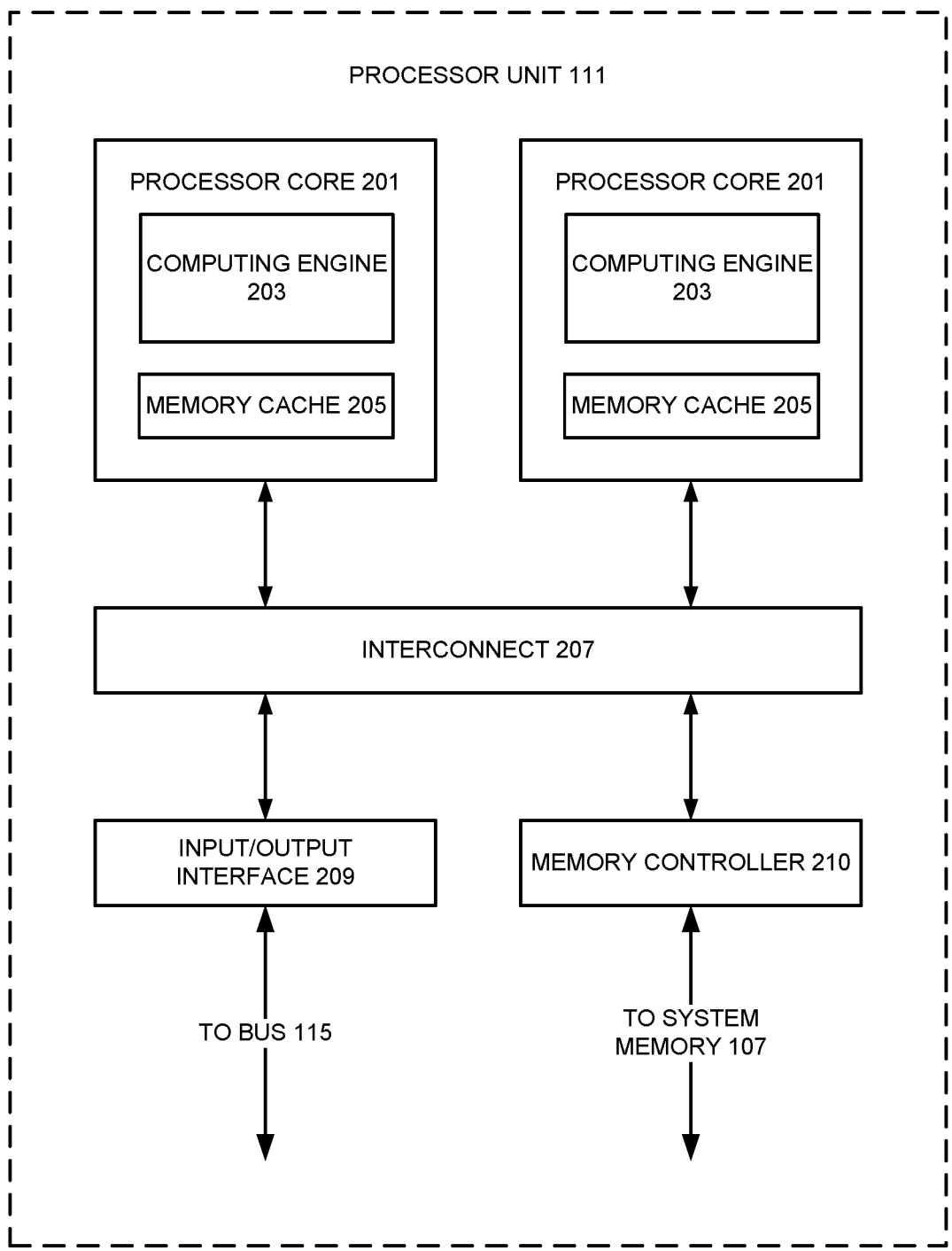
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Design Flow and Reliability Verification

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Process variations and technical limitations of the lithography techniques can make it difficult or even impossible to print some layout features. To achieve a high overall yield and reliability for the design, the layout is measured by a set of geometric constraints, or design rules, specific to a particular lithographic process before tapeout. Design rule checking is thus a major step during physical verification signoff on the design. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes (e.g., optical proximity correction), that modify the layout design data to improve the usable resolution of the reticle or mask created from the design in a photolithographic manufacturing process.

Circuit designs and layout designs are also reviewed for reliability issues caused by the electrical system. This is sometimes referred to as reliability verification. Reliability verification can include reviewing the design for protection from electrostatic discharge (ESD) events, detecting electrical overstress (EOS) situations, performing voltage-aware design rule checking (VDRC), or the like.

Circuit Design Verification Tool

Figure 3:
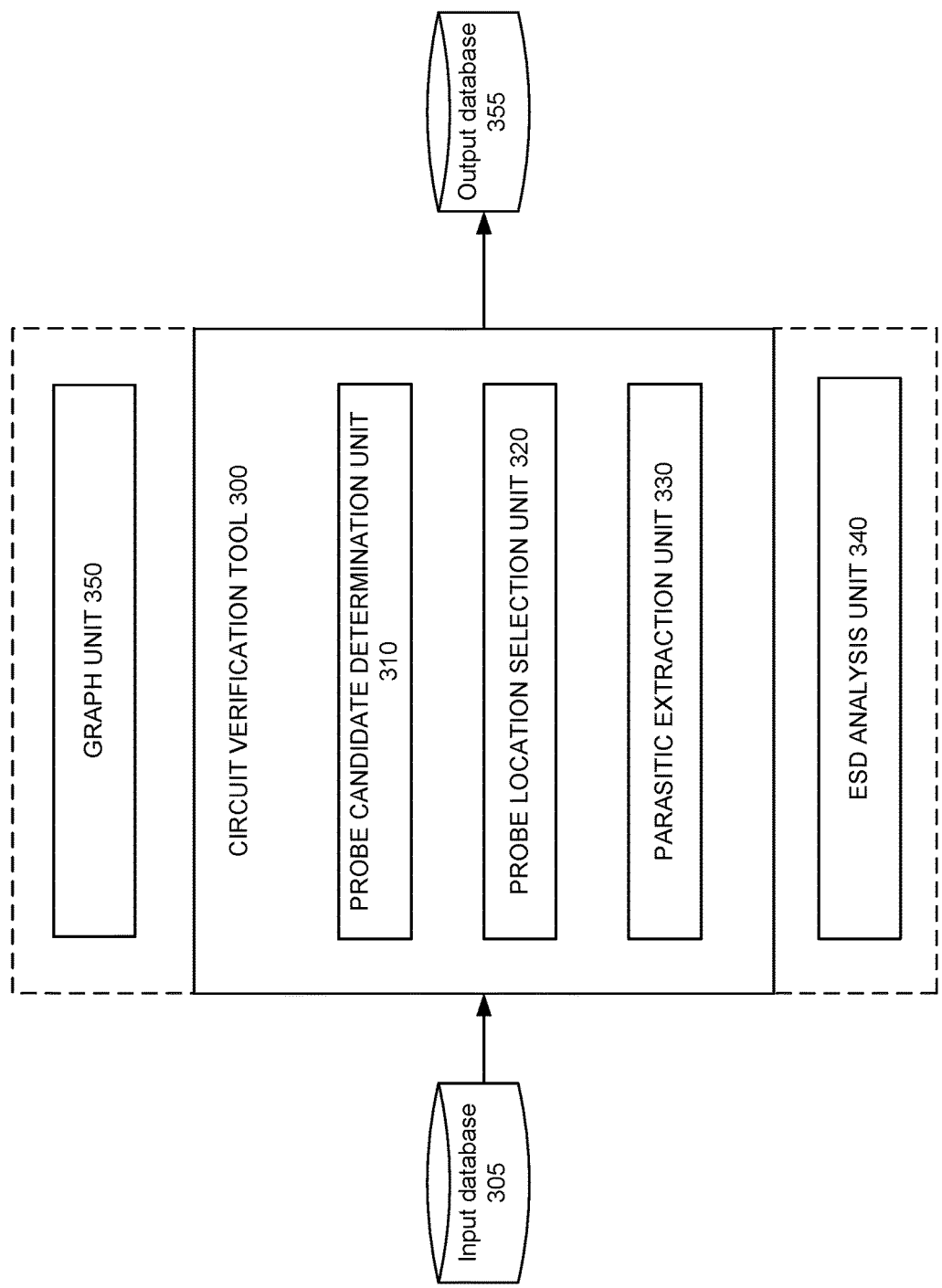
FIG. 3 illustrates an example of a circuit design verification tool according to various embodiments of the disclosed technology.

FIG. 3 illustrates an example of a circuit design verification tool 300 that may be implemented according to various embodiments of the disclosed technology. As seen in this figure, the circuit design verification tool 300 includes a probe candidate determination unit 310, a probe location selection unit 320, and a parasitic extraction unit 330. Some implementations of the circuit design verification tool 300 may cooperate with (or incorporate) one or more of an ESD analysis unit 340, a graph unit 350, an input database 305 and an output database 355.

As will be discussed in more detail below, the probe candidate determination unit 310 identifies probe location candidates for parasitic extraction from geometric elements on a probe layer. The probe layer is a physical layer of a layout design for a circuit design predetermined for placing one or more new probes. The probe location candidates are geometric elements on the probe layer within a boundary of an area having a predetermined size and covering an original probe location or having a distance from the original probe location less than a predetermined value. The probe location candidates are conductively connected to the original probe location. The original probe location is on a geometric element representing a device pin of the circuit design on another physical layer. The probe location selection unit 320 selects one or more new probe locations on the probe location candidates based on predetermined criteria. The parasitic extraction unit 330 extracts, from the layout design, a parasitic resistance value for parasitic resistance between a geometric element representing a circuit pad or another device pin and the one or more new probe locations. The ESD analysis unit 340 may conduct an ESD analysis based on the parasitic resistance value. The circuit design verification tool 300 reports the parasitic resistance value and/or the result of the ESD analysis. The reporting may comprise storing in the output database 355 and/or displaying by the graph unit 360.

As previously noted, various examples of the disclosed technology may be implemented by one or more computing systems, such as the computing system illustrated in FIGS. 1 and 2. Accordingly, one or more of the probe candidate determination unit 310, the probe location selection unit 320, the parasitic extraction unit 330, and the ESD analysis unit 340 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the probe candidate determination unit 310, the probe location selection unit 320, the parasitic extraction unit 330, and the ESD analysis unit 340. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the probe candidate determination unit 310, the probe location selection unit 320, the parasitic extraction unit 330, the ESD analysis unit 340, and the graph unit 360 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Parasitic Extraction Based on Automatic Probe Moving

Figure 4:
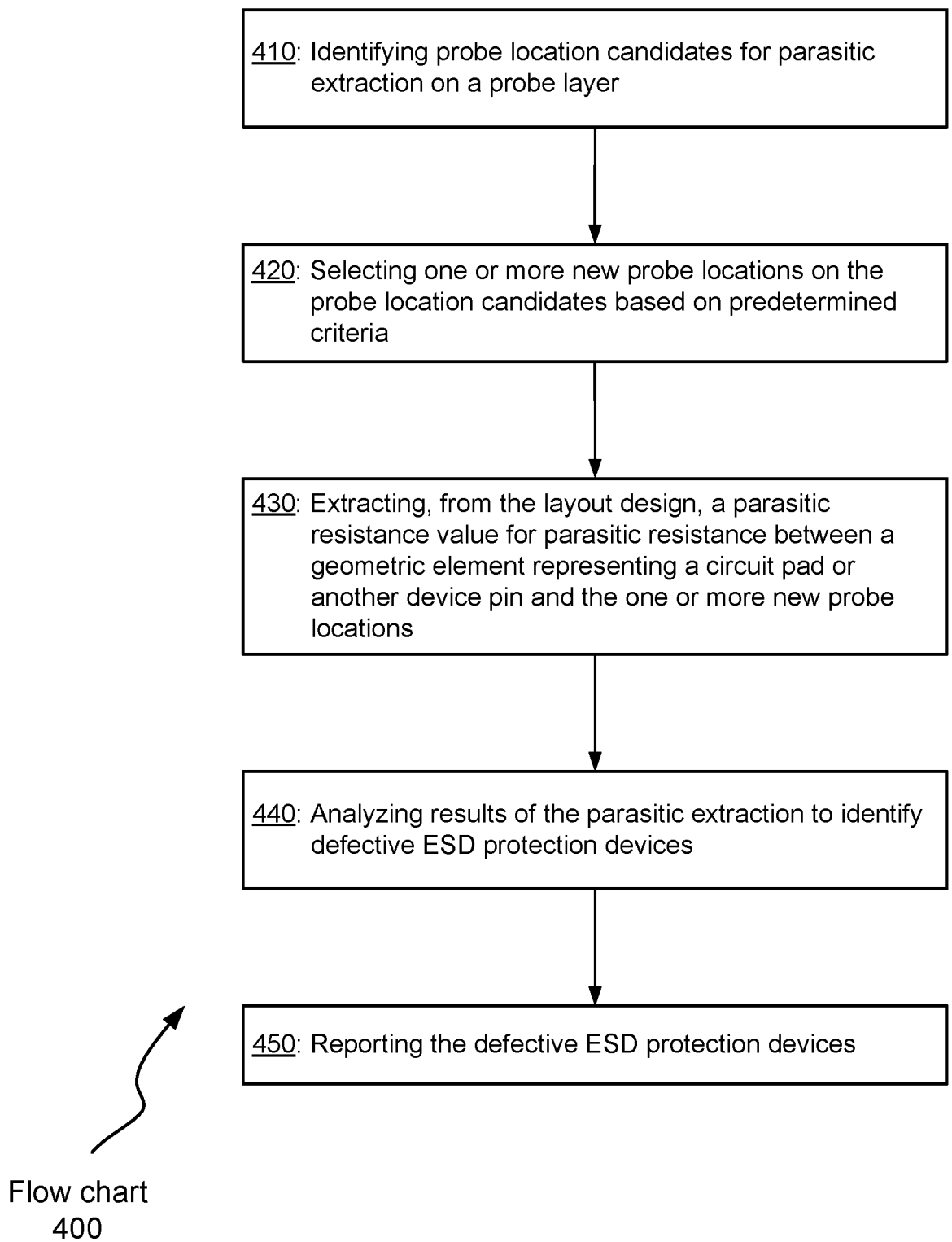
FIG. 4 illustrates a flowchart showing of a process parasitic extraction based on automatic moving of probe locations that may be implemented according to various examples of the disclosed technology.

FIG. 4 illustrates a flowchart 400 showing a process of parasitic extraction based on automatic moving of probe locations that may be implemented according to various examples of the disclosed technology. For ease of understanding, methods of parasitic extraction based on automatic moving of probe locations that may be employed according to various embodiments of the disclosed technology will be described with reference to the circuit design verification tool 300 in FIG. 3 and the flow chart 400 illustrated in FIG. 4. It should be appreciated, however, that alternate implementations of a circuit design verification tool may be used to perform the methods of parasitic extraction based on automatic moving of probe locations illustrated by the flow chart 400 according to various embodiments of the disclosed technology. Likewise, the circuit design verification tool 300 may be employed to perform other methods of parasitic extraction based on automatic moving of probe locations according to various embodiments of the disclosed technology.

In operation 410, the probe candidate determination unit 310 identifies probe location candidates for parasitic extraction from geometric elements on a probe layer. The probe layer is a physical layer of a layout design for a circuit design predetermined for placing one or more new probes. Physical layers typically include metal (interconnect) layers, via layers, polysilicon layers, diffusion layers, and ionic implantation layers. A metal layer has interconnect conducting wires, and a via layer has vias connecting a lower metal layer with a higher metal layer. Sometimes, metal layers and via layers are referred to as metallization layers. Contacts or bumps (pads) are typically fabricated on top of the highest metal layer. The interconnect conducting wires and vias on the metallization layers connect individual devices or components (transistors, capacitors, etc.) formed on other layers to each other to distribute signals, as well as power and ground. Interconnect wires (interconnect lines or simply interconnects) close to the transistors need to be small, as they attach/join to the components that are themselves very small and often closely packed together. These interconnect lines on the lower-level metal layers (sometimes called local interconnect layers) are usually thin and short in length. Global interconnects are higher up in the structure; they travel between different blocks of the circuit and are thus typically thick, long, and widely separated. The probe layer may be a diffusion layer or a metallization layer.

The probe location candidates are geometric elements on the probe layer. They are within a boundary of an area having a predetermined size and covering an original probe location or having a distance from the original probe location less than a predetermined value. Moreover, the probe location candidates are conductively connected to the original probe location. Here, the original probe location is on a geometric element representing a device pin of the circuit design on another physical layer.

Figure 5:
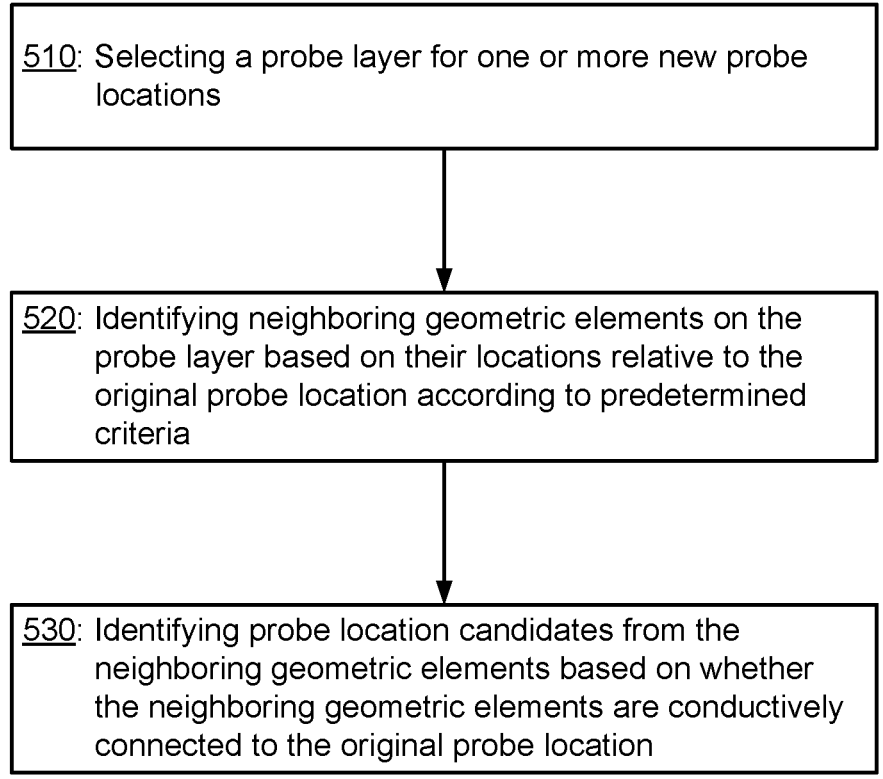
FIG. 5 illustrates a flowchart showing a process of identifying probe location candidates for parasitic extraction that may be implemented for the operation 410 according to various examples of the disclosed technology.

FIG. 5 illustrates a flowchart 500 showing a process of identifying probe location candidates for parasitic extraction that may be implemented for the operation 410 according to various examples of the disclosed technology. In operation 510, the probe candidate determination unit 310 selects a probe layer from the physical layers of the layout design predetermined for placing the one or more new probes. In operation 520, the probe candidate determination unit 310 identifies neighboring geometric elements on the probe layer based on their locations relative to the original probe location according to predetermined criteria. The neighboring geometric elements may be geometric elements within a halo centered at a location on the probe layer corresponding to the original probe location on the another physical layer. The halo may be a circle, a square, or a rectangle. Or the neighboring geometric elements may be geometric elements having a distance from the original probe location less than the predetermined value. In operation 530, the probe candidate determination unit 310 identifies probe location candidates from the neighboring geometric elements based on whether the neighboring geometric elements are conductively connected to the original probe location. The probe location candidates should be conductively connected to the original probe location.

Figure 6:
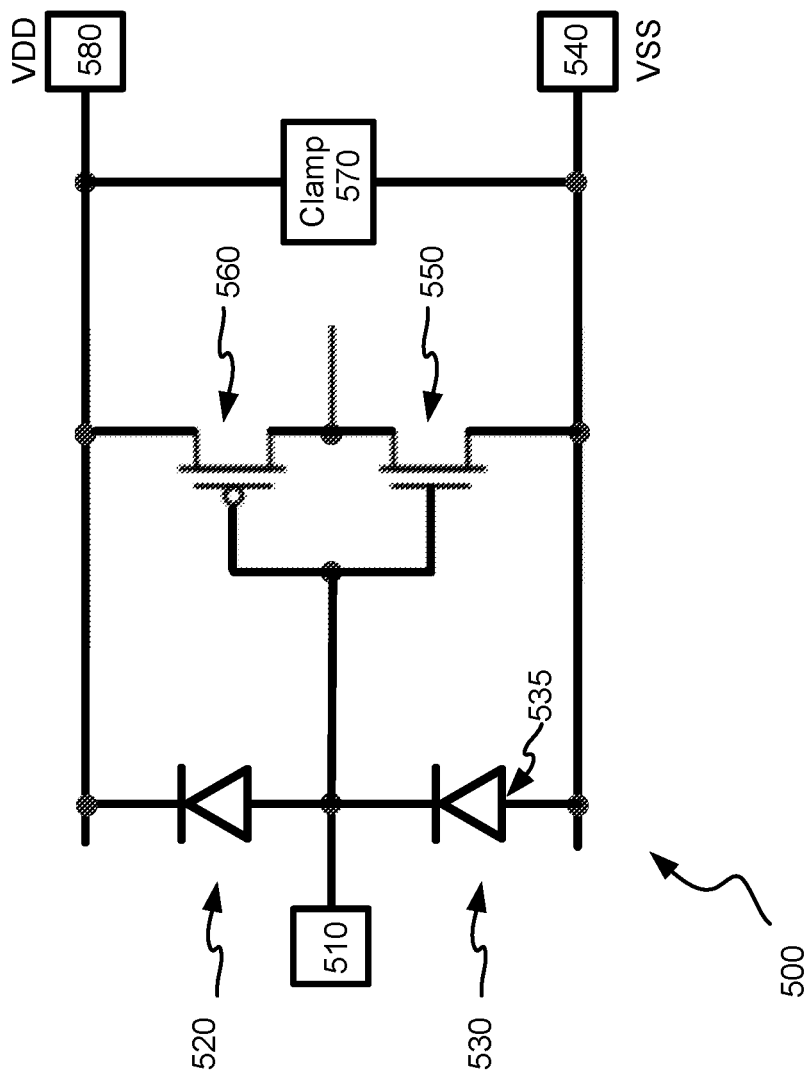
FIG. 6 illustrates an example of an ESD protection circuit.

FIG. 6 illustrates an example of an ESD protection circuit 500. The ESD protection circuit 500 has a signal input pad 610 and two power pads 540 (VSS) and 580 (VDD). The input pad is coupled to the gates of two transistors 550 and 560, which is the input stage of a functional circuit block. Two diodes 520 and 530, along with a clamp device 570, serve as ESD protection. An ESD protection evaluation and verification process can include many checks. One of them is to check the parasitic resistance value between a pin 535 of the diode 530 and the power pad 540.

Figure 7:
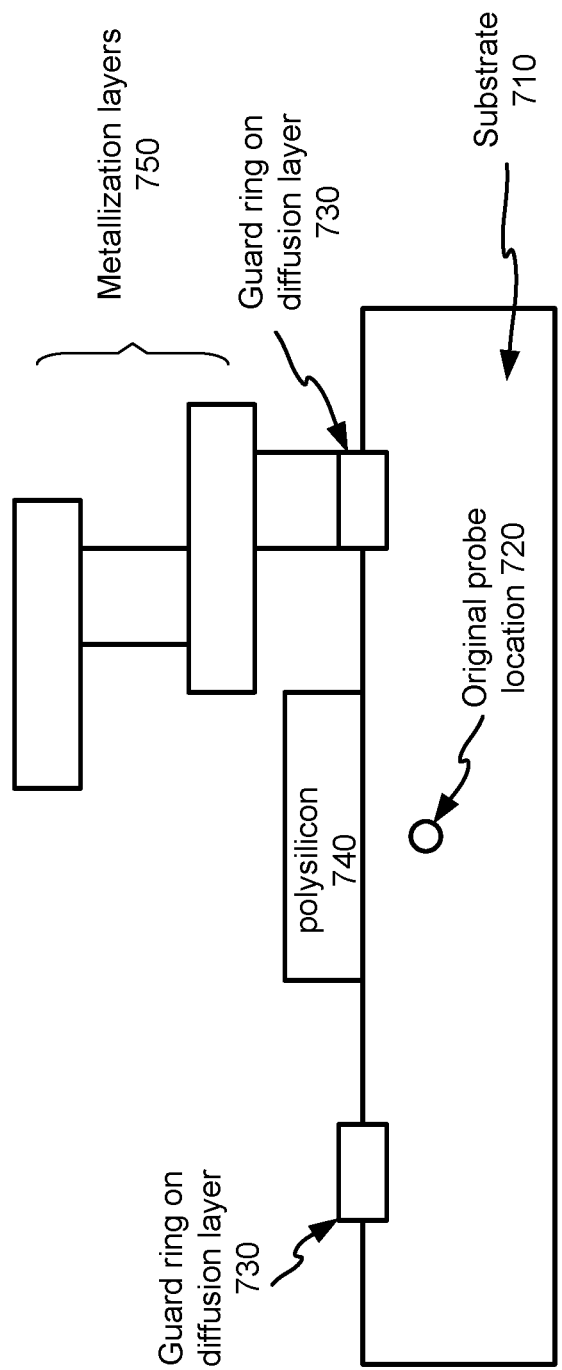
FIG. 7 illustrates an example of a cross-section of a diode.

FIG. 7 illustrates an example of a cross-section of a diode. Without loss of generality, assume substrate 710 is a p-type substrate. A polysilicon feature forms one pin of the diode and the other pin is typically assumed to be at an original probe location 720. The original probe location 720 is coupled to a guard ring 730 on a diffusion layer. The guard ring 730 is coupled to a power pad through metallization layers 750. The parasitic resistance between the power pad and the original probe location 720 is a sum of parasitic resistance of the metal conductive wires/vias and resistance between the guard ring 730 and the original probe location 720. The former can be derived quickly and accurately. As for the latter, two-dimensional fracturing and three-dimensional analysis can lead to an accurate result. This approach, however, is time-consuming and thus cannot be used for a full-chip ESD verification. A conventional simple-modeling approach cannot be applicable as well. If substrate is modelled with high resistance to avoid shorting between pin pairs of the diode, the obtained parasitic resistance may be too pessimistic.

Figure 8:
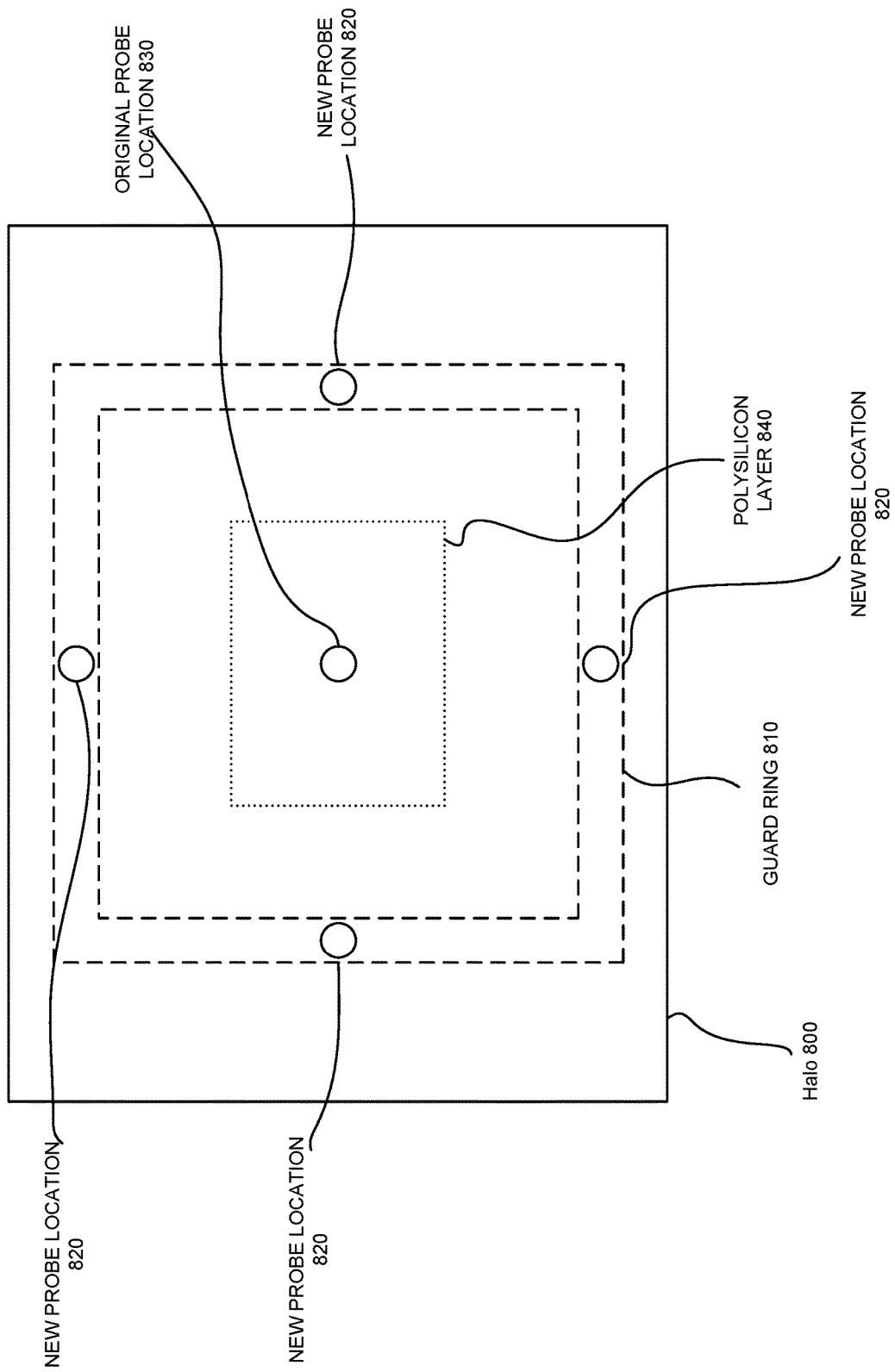
FIG. 8 illustrates a top-down view of the diode shown in FIG. 7.

With various implementations of the disclosed technology, the circuit design verification tool 300 can move the probe to a higher physical layer to overcome the above-mentioned challenge. FIG. 8 illustrates a top-down view of the diode shown in FIG. 7. A square 840 is on the polysilicon layer, indicating the diode location. The probe candidate determination unit 310 first selects the diffusion layer where the guard ring 800 is located as the probe layer. The diffusion layer may be provided by a user or pre-set as a default for diodes by the circuit design verification tool 300. The probe candidate determination unit 310 then searches for geometric elements on the diffusion layer within a halo 800. The halo 800 is centered at a location on the probe layer corresponding to the original probe location 830. The guard ring 810 is within the halo 800 and is thus identified as a neighboring geometric element. The probe candidate determination unit 310 may or may not find other geometric features within the halo 800. Finally, the probe candidate determination unit 310 check the conductivity between the neighboring geometric element(s) and the original probe location. In this case, only the guard ring 810 is both within the halo 800 and is conductively connected to the original probe location. As such, the probe candidate determination unit 310 designate the guard ring 810 as the probe location candidate.

A person of ordinary skill in the art will appreciate that the probe candidate determination unit 310 may search for geometric elements on the diffusion layer 810 which are conductively connected to the original probe location 830 first. Then, the probe candidate determination unit 310 can check which of the derived geometric elements are within the halo 800 as an alternative method.

Figure 9:
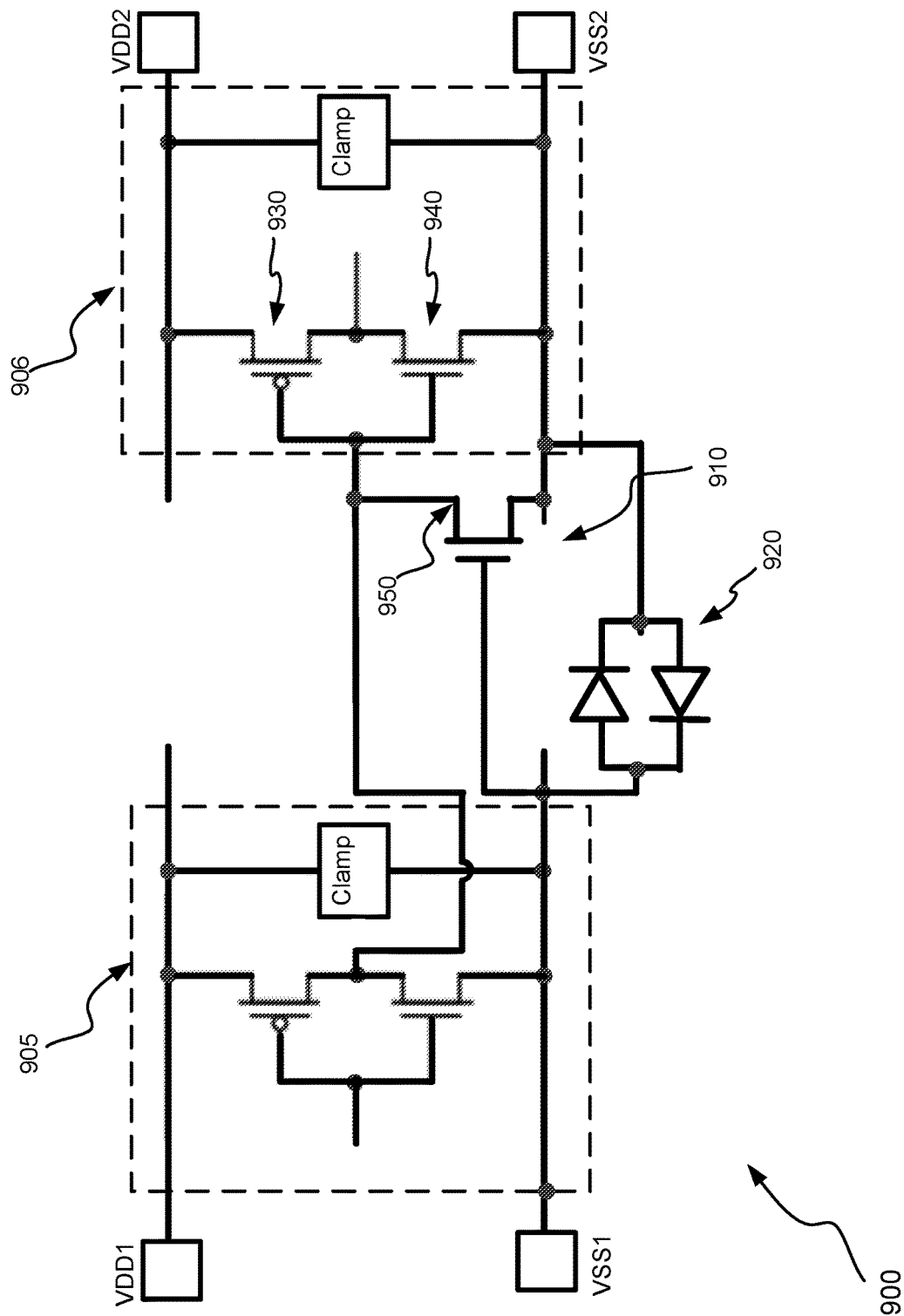
FIG. 9 illustrates another example of an ESD protection circuit.

FIG. 9 illustrates another example of an ESD protection circuit 900. The ESD protection circuit 900 has two ESD protection devices 910 and 920 between two power domains 905 and 906. The ESD protection devices 910 is a transistor and the ESD protection devices 920 is a pair of diodes. An ESD protection evaluation and verification process can include a check on the parasitic resistance value between a pin 950 of the transistor 910 and a gate pin of either transistor 930 or transistor 940.

Figure 10:
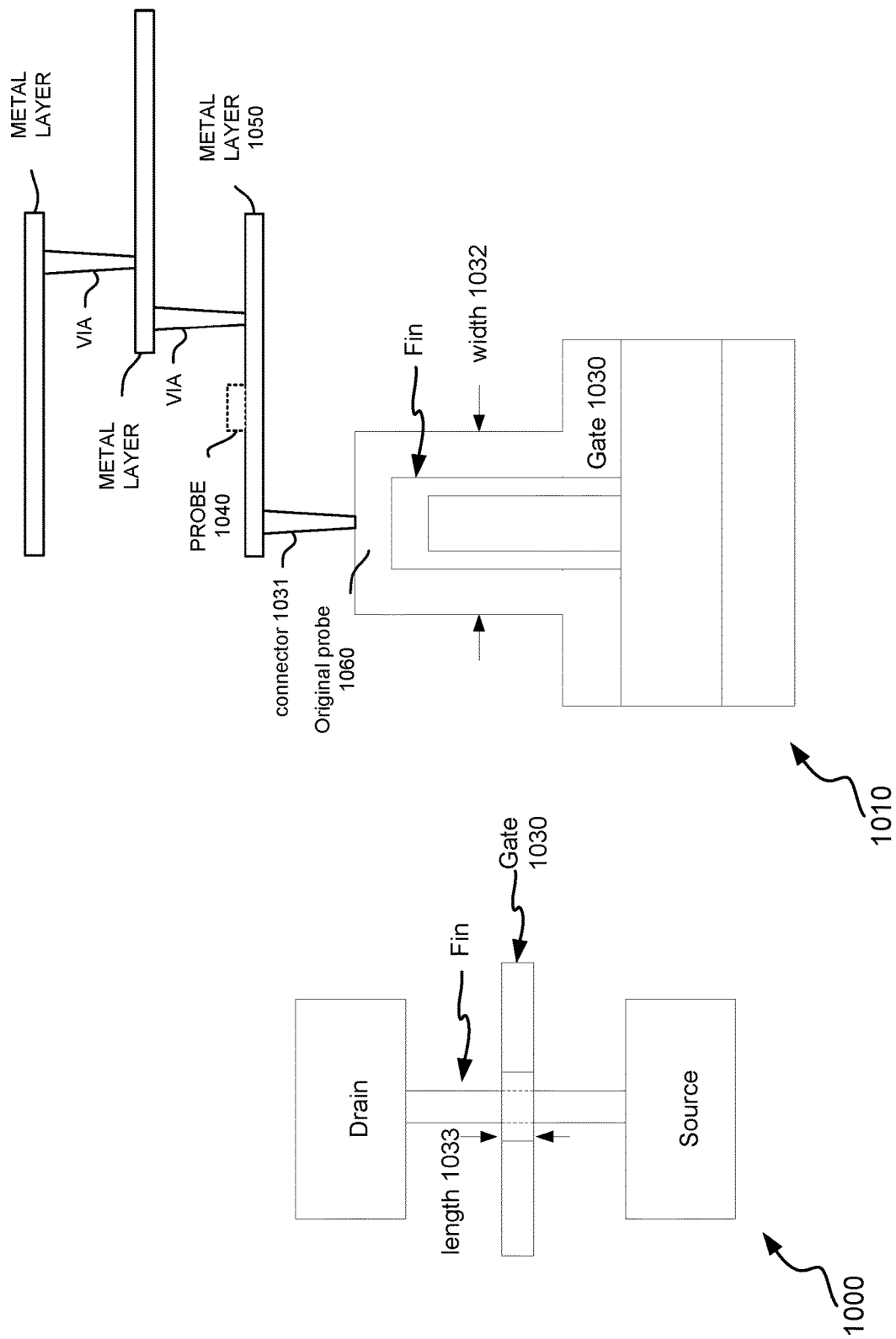
FIG. 10 illustrates an example of a FINFET in two different views: a top-down view and a cross-section view.

Fin Field-effect transistors (FinFET) has become the dominate gate design at 14 nm, 10 nm, and 7 nm process nodes. Unlike planar designs, FinFET designs use a conducting channel that rises above the level of the insulator, creating a thin silicon structure, shaped like a fin as a gate electrode. This fin-shaped electrode allows multiple gates to operate on a single transistor by warping the gate electrode around the silicon conducting channel. FIG. 10 illustrates an example of a FINFET in two different views: a top-down view 1010 and a cross-section view 1020. The gate electrode 1030, made of polysilicon, is very thin—the width 1032 and the length 1033 are small. A connector 1031 connects the gate electrode 1030 to a metal layer 1050. The connector 1031 may comprise a silicide module and a contact module A conventional parasitic extraction approach would place the probe (original probe 1060) on the gate electrode 1030 (polysilicon layer). However, it is time-consuming to derive the resistance below the metal layer 1050.

Figure 11:
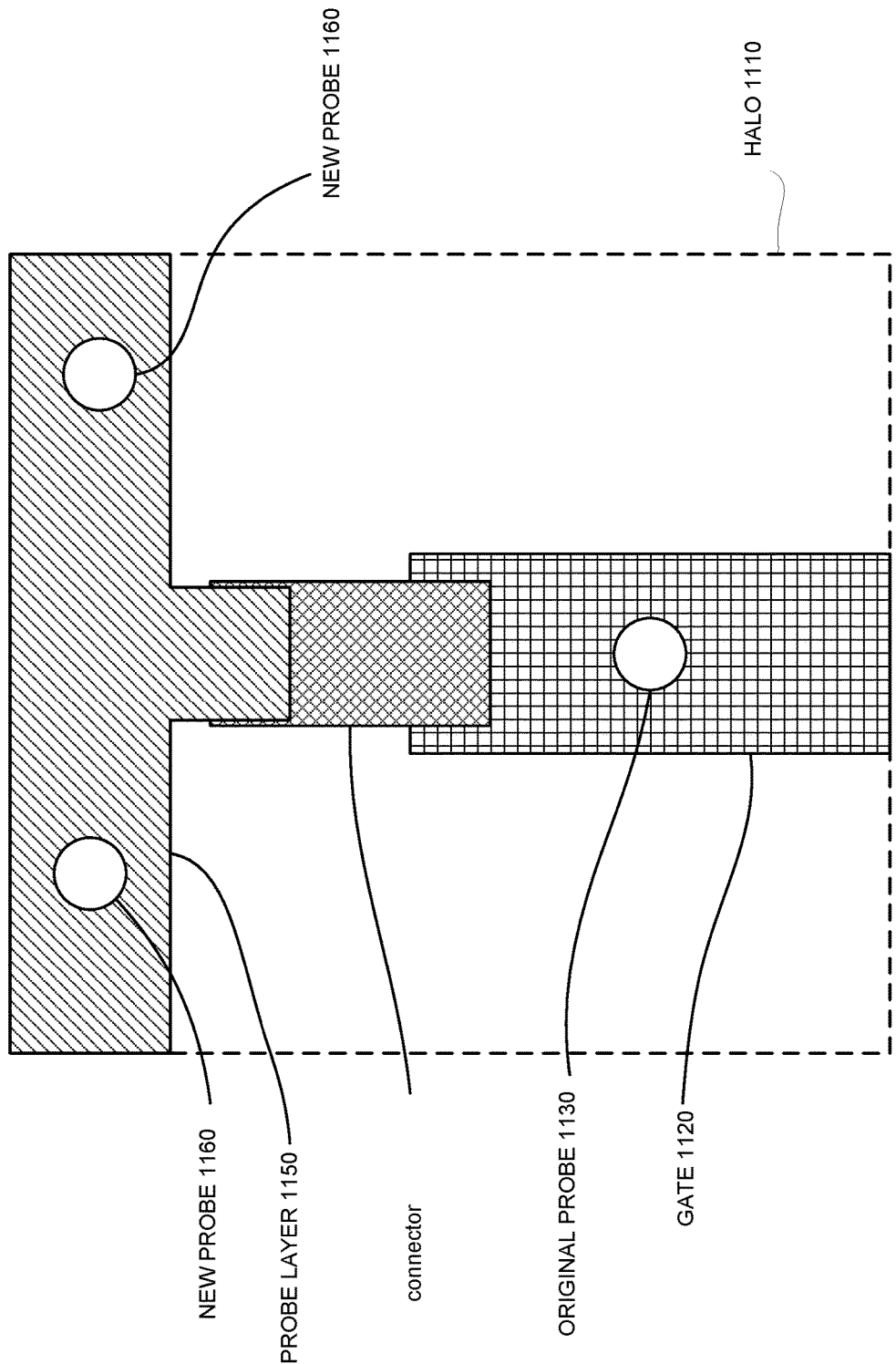
FIG. 11 illustrates another cross-section view of the transistor shown in FIG. 10.

With various implementations of the disclosed technology, the circuit design verification tool 300 can move the probe to the metal layer 1050 to overcome the above-mentioned challenge. FIG. 11 illustrates another cross-section view of the transistor shown in FIG. 10. The probe candidate determination unit 310 first selects a metal layer as the probe layer 1150. The location of the probe layer 1150 may be provided by a user or pre-set as a default for FINFETs by the circuit design verification tool 300. The probe candidate determination unit 310 then searches for geometric elements on the probe layer within a halo 1110 or within a certain distance from the gate electrode 1120. The halo 1110 is centered at a location on the probe layer corresponding to the original probe location 1130. Metal wires within the halo 1110 are thus identified as neighboring geometric elements. Finally, the probe candidate determination unit 310 check the conductivity between the neighboring geometric element(s) and the original probe location, only those conductively connected to the gate electrode 1120 are designated as the probe location candidates.

Again, a person of ordinary skill in the art will appreciate that the probe candidate determination unit 310 may search for geometric elements on the probe layer 1150 which are conductively connected to the gate electrode 1120 first. Then, the probe candidate determination unit 310 can check which of the derived geometric elements are within the halo 1110 as an alternative method.

Refer back to the flowchart 400. In operation 420, the probe location selection unit 320 selects one or more new probe locations on the probe location candidates based on predetermined criteria. The predetermined criteria may specify the new probe locations to be evenly placed on the probe location candidates such as new probe locations 820 shown in FIG. 8. Alternatively, the predetermined criteria may specify the new probe locations to have a certain distance from the original probe location such as new probe locations 820 shown in FIG. 8 and new probe locations 1160 shown in FIG. 11.

In operation 430, the parasitic extraction unit 330 extracts, from the layout design, a parasitic resistance value for parasitic resistance between a geometric element representing a circuit pad or another device pin and the one or more new probe locations. The parasitic extraction unit 330 may be implemented by various parasitic extraction tools such as those in the Calibre family of software tools available from Mentor Graphics Corporation, Wilsonville, Oreg.

In operation 440, the ESD analysis unit 340 conducts an ESD analysis based on the parasitic resistance value. If the result shows a part of ESD circuitry cannot meet the specification, that part of ESD circuitry may be modified.

In operation 450, the circuit design verification tool 300 reports the parasitic resistance value and/or the result of the ESD analysis. The reporting may comprise storing and/or displaying results of the circuit design verification. The circuit design verification tool 300 (or the graph unit 350) may annotate the graphical representation of the circuit design with indications of ESD protection problems, for example, which can identify a location of the ESD protection problems, the corresponding rule prompting the ESD protection problems, or the like. In some embodiments, the graph display unit 350 may display the annotated graphical representation of the circuit design on a display device.

Figure 12:
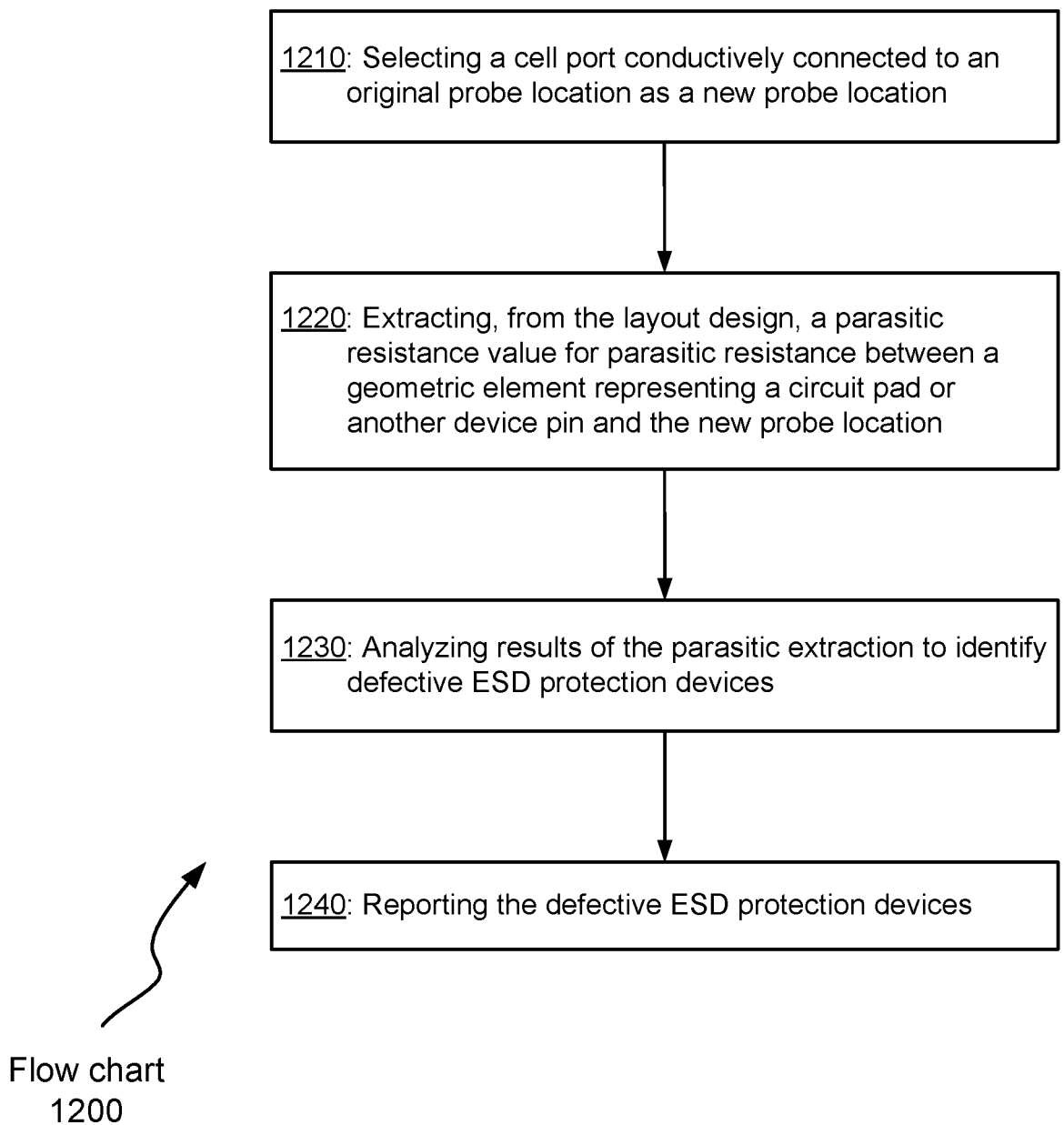
FIG. 12 illustrates a flowchart showing a process of parasitic extraction based on automatic moving of probe locations to cell ports that may be implemented according to various examples of the disclosed technology.

FIG. 12 illustrates a flowchart 1200 showing a process of parasitic extraction based on automatic moving of probe locations to cell ports that may be implemented according to various examples of the disclosed technology. For ease of understanding, methods of parasitic extraction based on automatic moving of probe locations to cell ports that may be employed according to various embodiments of the disclosed technology will be described with reference to the circuit design verification tool 300 in FIG. 3 and the flow chart 1200 illustrated in FIG. 12. It should be appreciated, however, that alternate implementations of a circuit design verification tool may be used to perform the methods of parasitic extraction based on automatic moving of probe locations to cell ports illustrated by the flow chart 1200 according to various embodiments of the disclosed technology. Likewise, the circuit design verification tool 300 may be employed to perform other methods of parasitic extraction based on automatic moving of probe locations to cell ports according to various embodiments of the disclosed technology.

Figure 13:
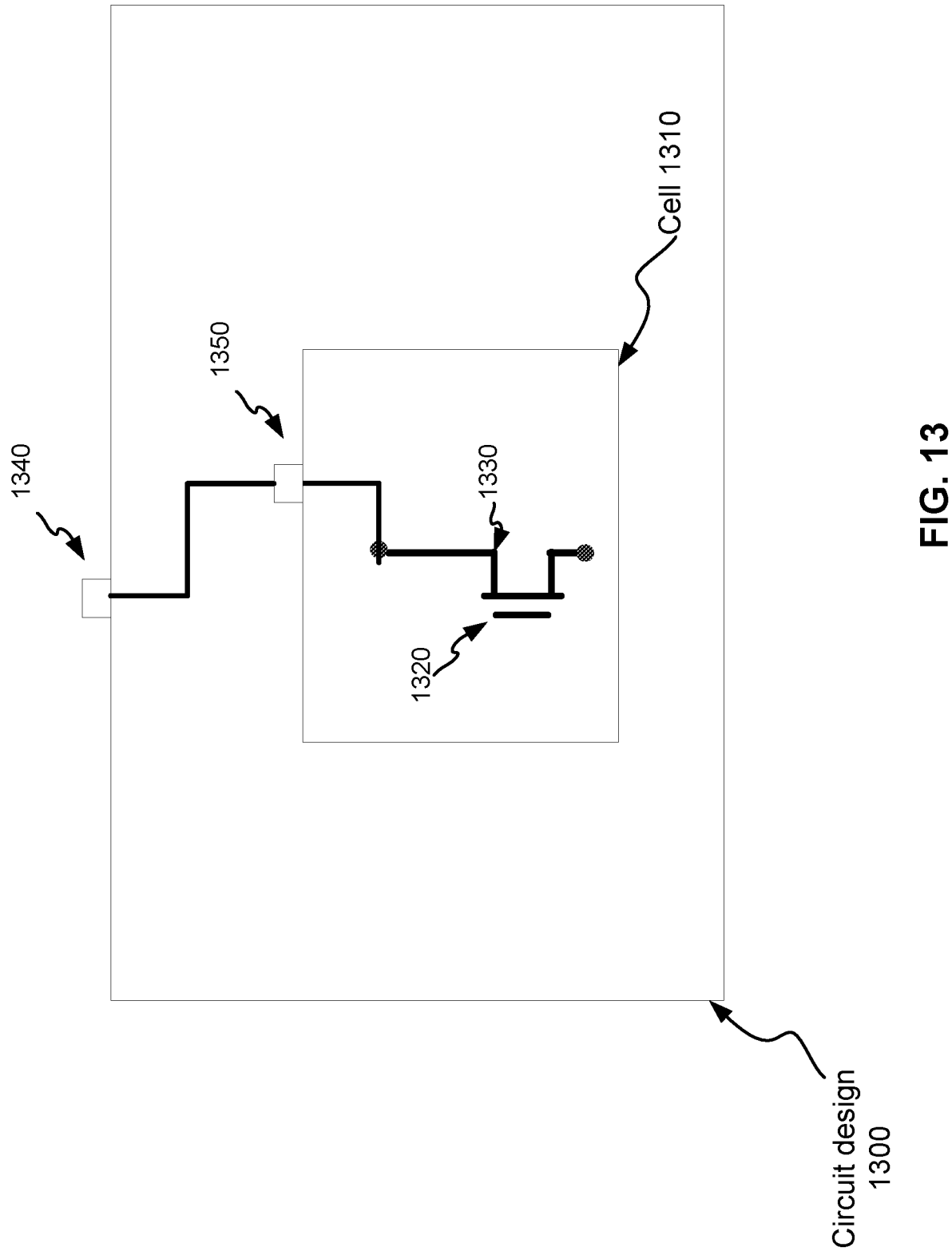
FIG. 13 illustrates an example of a circuit design comprising a cell.

In operation 1210, the probe location selection unit 320 selects a cell port conductively connected to an original probe location as a new probe location. FIG. 13 illustrates an example of a circuit design 1300 comprising a cell 1310. In the cell 1310, an original probe 1330 is located at a pin of a transistor 1320. The other original probe for parasitic extraction is at a pad 1340 of the circuit design 1300. A cell port 1350 of the cell 1310 is conductively connected to the original probe 1330. As such, the probe location selection unit 320 selects the cell port 1350 as the new probe location. It should be noted that the original probe may be located at a cell port of a smaller cell. This original probe may be obtained by moving a probe location from a device pin or a cell port of a smaller cell. This can significantly reduce the amount of computation time and take advantage of the hierarchical data structure of a circuit design.

In operation 1220, the parasitic extraction unit 330 extracts, from the layout design, a parasitic resistance value for parasitic resistance between a geometric element representing a circuit pad or another device pin and the new probe location. The parasitic extraction unit 330 may be implemented by various parasitic extraction tools such as those in the Calibre family of software tools available from Mentor Graphics Corporation, Wilsonville, Oreg.

In operation 1230, the ESD analysis unit 340 conducts an ESD analysis based on the parasitic resistance value. The ESD analysis unit 340 may sum the parasitic resistance value with the parasitic resistance value between the original probe location and the new probe location. The latter may be determined based on the method illustrated in the flowchart 400. If the result shows a part of ESD circuitry cannot meet the specification, that part of ESD circuitry may be modified.

In operation 1240, the circuit design verification tool 300 reports the parasitic resistance value and/or the result of the ESD analysis. The reporting may comprise storing and/or displaying results of the circuit design verification.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:

identifying probe location candidates for parasitic extraction from geometric elements on a probe layer, the probe layer being a physical layer of a layout design for a circuit design predetermined for placing one or more new probes, the probe location candidates being geometric elements on the probe layer within a boundary of an area having a predetermined size and covering an original probe location or having a distance from the original probe location less than a predetermined value, the probe location candidates being conductively connected to the original probe location, and the original probe location being on a geometric element representing a device pin of the circuit design on another physical layer;

selecting one or more new probe locations on the probe location candidates based on predetermined criteria; and extracting, from the layout design, a parasitic resistance value for parasitic resistance between a geometric element representing a circuit pad or another device pin and the new one or more probe locations.

2. The method recited in claim 1, further comprising:
conducting an ESD analysis based on the parasitic resistance value; and
reporting the parasitic resistance value, the result of the ESD analysis, or both.

3. The method recited in claim 1, wherein the original probe location is an electrode of a diode, the probe layer is a diffusion layer, and the probe location candidates comprise a guard ring for the diode.

4. The method recited in claim 1, where the original probe location is a gate electrode of a transistor and the probe layer is a metal layer.

5. The method recited in claim 1, wherein the area forms a halo surrounding a location on the probe layer corresponding to the original probe location.

6. The method recited in claim 1, wherein the predetermined criteria comprise distance from the original probe location, distance between the one or more new probe locations, configuration of the one or more new probe locations, or any combination thereof.

7. One or more non-transitory computer-readable media storing computer-executable instructions for causing one or more processors to perform a method, the method comprising:
identifying probe location candidates for parasitic extraction from geometric elements on a probe layer, the probe layer being a physical layer of a layout design for a circuit design predetermined for placing one or more new probes, the probe location candidates being geometric elements on the probe layer within a boundary of an area having a predetermined size and covering an original probe location or having a distance from the original probe location less than a predetermined value, the probe location candidates being conductively connected to the original probe location, and the original probe location being on a geometric element representing a device pin of the circuit design on another physical layer;
selecting one or more new probe locations on the probe location candidates based on predetermined criteria; and
extracting, from the layout design, a parasitic resistance value for parasitic resistance between a geometric element representing a circuit pad or another device pin and the new one or more probe locations.

8. The one or more non-transitory computer-readable media recited in claim 7, wherein the method further comprises:
conducting an ESD analysis based on the parasitic resistance value; and
reporting the parasitic resistance value, the result of the ESD analysis, or both.

9. The one or more non-transitory computer-readable media recited in claim 7, wherein the original probe location is an electrode of a diode, the probe layer is a diffusion layer, and the probe location candidates comprise a guard ring for the diode.

10. The one or more non-transitory computer-readable media recited in claim 7, where the original probe location is a gate electrode of a transistor and the probe layer is a metal layer.

11. The one or more non-transitory computer-readable media recited in claim 7, wherein the area forms a halo surrounding a location on the probe layer corresponding to the original probe location.

12. The one or more non-transitory computer-readable media recited in claim 7, wherein the predetermined criteria comprise distance from the original probe location, distance between the one or more new probe locations, configuration of the one or more new probe locations, or any combination thereof.

13. A method, executed by at least one processor of a computer, comprising:
selecting a cell port of a first cell conductively connected to an original probe location as a new probe location, the original probe location being on a geometric element representing a device pin of the circuit design on a physical layer of a layout design of a circuit design or a cell port of a second cell, the second cell being inside the first cell; and
extracting, from the layout design, a parasitic resistance value for parasitic resistance between a geometric element representing a circuit pad or another device pin and the new probe location.

14. The method recited in claim 13, wherein the method further comprises:
conducting an ESD analysis based on the parasitic resistance value; and
reporting the parasitic resistance value, the result of the ESD analysis, or both.

15. One or more non-transitory computer-readable media storing computer-executable instructions for causing one or more processors to perform a method, the method comprising:
selecting a cell port of a first cell conductively connected to an original probe location as a new probe location, the original probe location being on a geometric element representing a device pin of the circuit design on a physical layer of a layout design of a circuit design or a cell port of a second cell, the second cell being inside the first cell; and
extracting, from the layout design, a parasitic resistance value for parasitic resistance between a geometric element representing a circuit pad or another device pin and the new probe location.

16. The one or more non-transitory computer-readable media recited in claim 15, wherein the method further comprises:
conducting an ESD analysis based on the parasitic resistance value; and
reporting the parasitic resistance value, the result of the ESD analysis, or both.

* * * * *